US010177746B1

(12) United States Patent
Lin

(10) Patent No.: US 10,177,746 B1
(45) Date of Patent: Jan. 8, 2019

(54) OVERDRIVE VOLTAGE GENERATOR

(71) Applicant: Winbond Electronics Corp., Taichung, TN (US)

(72) Inventor: Chih-Feng Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/040,557

(22) Filed: Jul. 20, 2018

(51) Int. Cl.
*G11C 11/4091* (2006.01)
*G11C 11/4076* (2006.01)
*H03K 3/012* (2006.01)
*H03K 19/20* (2006.01)
*H03K 19/0175* (2006.01)
*H03K 17/687* (2006.01)
*G11C 11/4074* (2006.01)
*H03K 5/24* (2006.01)

(52) U.S. Cl.
CPC .......... *H03K 3/012* (2013.01); *G11C 11/4074* (2013.01); *G11C 11/4091* (2013.01); *H03K 5/24* (2013.01); *H03K 17/687* (2013.01); *H03K 19/017509* (2013.01); *H03K 19/20* (2013.01)

(58) Field of Classification Search
CPC ................ H03K 3/012; H03K 17/687; H03K 19/017509; H03K 19/20; G11C 11/4074; G11C 11/4091
USPC .................. 327/306, 333; 326/62–63, 80–83
See application file for complete search history.

(56) References Cited

U.S. PATENT DOCUMENTS

| 5,907,505 A * | 5/1999 | Tomita .................... G11C 5/145 365/185.18 |
| 6,356,161 B1 | 3/2002 | Nolan et al. |
| 8,542,036 B2 * | 9/2013 | Bae ...................... H04L 25/0272 327/108 |
| 8,570,815 B2 * | 10/2013 | Nakaoka .................. G11C 7/04 365/189.09 |
| 9,886,995 B2 * | 2/2018 | Hwang ............... G11C 11/4094 |

(Continued)

FOREIGN PATENT DOCUMENTS

| CN | 104503532 | 4/2015 |
| TW | 201104230 | 2/2011 |

(Continued)

OTHER PUBLICATIONS

"Office Action of Taiwan Counterpart Application", dated Oct. 9, 2018, pp. 1-6.

*Primary Examiner* — Dinh T Le
(74) *Attorney, Agent, or Firm* — JCIPRNET

(57) ABSTRACT

An overdrive voltage generator includes a first switching circuit, a boosting circuit, a second switching circuit, and a comparison circuit. The first switching circuit is coupled between a first power supply and an output terminal and configured to be controlled by a switching signal to provide an overdrive voltage to the output terminal. The boosting circuit is coupled between a second power supply and a node and configured to boost a voltage of the second power supply to provide a pump voltage to the node. The second switching circuit is coupled between the node and the output terminal and configured to be controlled by the switching signal to provide the overdrive voltage to the output terminal. The comparison circuit is coupled to the first and second switching circuits as well as the output terminal and configured to compare the overdrive voltage with a first reference voltage to generate the switching signal.

19 Claims, 3 Drawing Sheets

(56) References Cited

U.S. PATENT DOCUMENTS

2010/0246305 A1    9/2010   Yang et al.
2011/0080797 A1    4/2011   Furutani

FOREIGN PATENT DOCUMENTS

| TW | 201505015 | 2/2015 |
| TW | I534578 | 5/2016 |
| TW | 201724724 | 7/2017 |

\* cited by examiner

OVERDRIVE VOLTAGE GENERATOR

TECHNICAL FIELD

The disclosure relates to a voltage generator; more particularly, the disclosure relates to an overdrive voltage generator.

DESCRIPTION OF RELATED ART

In general, to improve the sensing speed of a sensing amplifier (SA) of a dynamic random access memory (DRAM), an overdrive technology is often applied to a bit line highest-level voltage of the SA. Specifically, please refer to FIG. 1, which is a schematic view of power supply of a SA of a known DRAM. As shown in FIG. 1, a voltage regulator 630 may generate a bit line highest-level voltage VBLH according to a power of a second power supply VDD2 and provide the bit line highest-level voltage VBLH to a SA circuit 660 through a switch 650, so that the SA circuit 660 may sense signals of bit line pairs BL and/BL. Besides, during the initial operation time period of the SA circuit 660, a voltage regulator 610 and a voltage pump circuit 620 jointly provide an overdrive voltage VOD through the switch 640 to the SA circuit 660, so as to increase the sensing speed of the SA circuit 660. Here, the voltage regulator 610 generates the overdrive voltage VOD according to a power of a first power supply VDD1, and the voltage pump circuit 620 generates the overdrive voltage VOD according to the power of the second power supply VDD2.

Owing to the differences in the driving capabilities and the response speed of the voltage regulator 610 and the voltage pump circuit 620, the current output by the first power supply VDD1 and the current output by the second power supply VDD2 cannot be accurately controlled. Thereby, in case of different voltage drops of the overdrive voltage VOD, the power supply ratios between the first power supply VDD1 and the second power supply VDD2 are different. In addition, since the response speed of the voltage pump circuit 620 is slower than that of the voltage regulator 610, once the overdrive voltage VOD decreases because of the excessive transient load of the overdrive voltage VOD, the voltage pump circuit 620 may not be able to respond instantaneously. As a result, the voltage level of the overdrive voltage VOD cannot be quickly recovered.

To prevent the voltage level of the overdrive voltage VOD from late recovery due to the excessive transient load of the overdrive voltage VOD, an overdrive voltage generator may be provided exclusively for each bank of the DRAM. Said design, however, may limit the floor plan of each bank and the location of a decoupling capacitor.

SUMMARY

The disclosure provides an overdrive voltage generator that is able to control the power supply ratio between the first power supply and the second power supply and is characterized by quick response speed and a pre-pumping function.

In an embodiment, an overdrive voltage generator including a first switching circuit, a boosting circuit, a second switching circuit, and a comparison circuit is provided. The first switching circuit is coupled between a first power supply and an output terminal, and is configured to be controlled by a switching signal to provide an overdrive voltage to the output terminal. The boosting circuit is coupled between a second power supply and a node, and is configured to boost a voltage of the second power supply to provide a pump voltage to the node. The second switching circuit is coupled between the node and the output terminal, and is configured to be controlled by the switching signal to provide the overdrive voltage to the output terminal. The comparison circuit is coupled to the first switching circuit, the second switching circuit, and the output terminal, and is configured to compare the overdrive voltage with a first reference voltage to generate the switching signal.

According to an embodiment, the boosting circuit is further coupled to the comparison circuit to receive the switching signal and is controlled by the switching signal to boost the voltage of the second power supply and provide the pump voltage to the node.

In view of the above, the overdrive voltage generator provided in one or more embodiments may be deemed as a digital voltage regulator characterized by fast response speed and thus may be applied to provide the overdrive voltage required by operations of all SA circuits of the DRAM. Besides, the overdrive voltage generator may pump the voltage of the node in advance when the overdrive voltage is lower than the first reference voltage, so as to stabilize the pump voltage and prevent the pump voltage from being excessively drawn power and dropped too low.

In order to make the aforementioned and other features and advantages provided in the disclosure more comprehensible, several embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

In order to make the disclosure more comprehensible, embodiments are described below as the examples to show the scope of protection. In addition, whenever possible, identical or similar reference numbers stand for identical or similar elements in the figures and the embodiments.

Figure 1:
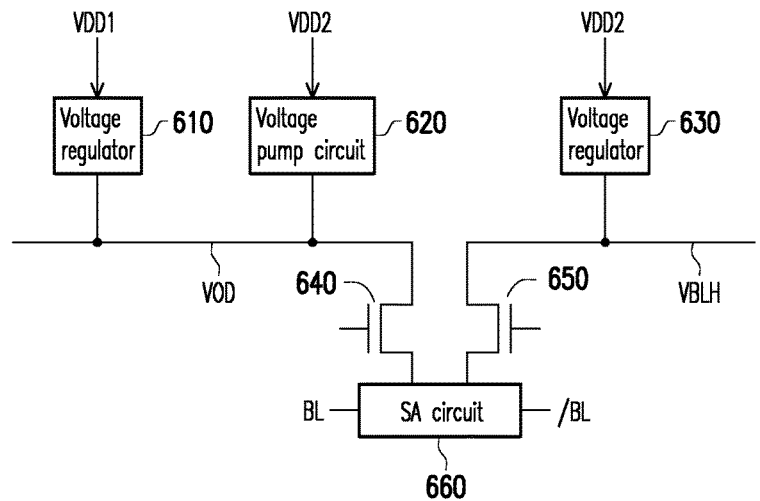
FIG. 1 is a schematic view of power supply of a SA of a known DRAM.
Figure 2:
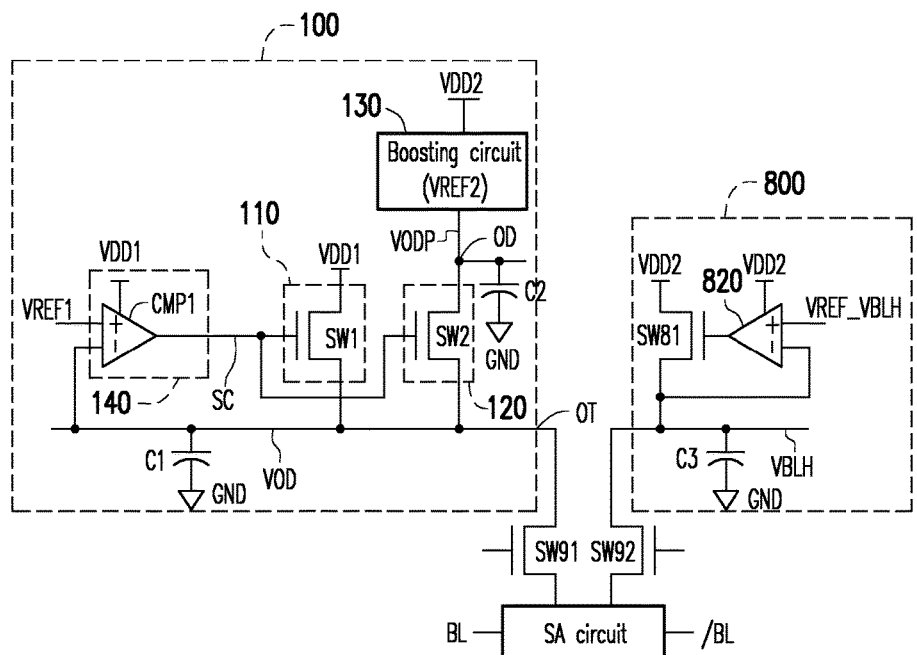
FIG. 2 is a schematic block and application view of an overdrive voltage generator according to an embodiment of the disclosure.

Please refer to FIG. 2, which is a schematic block and application view of an overdrive voltage generator according to an embodiment of the disclosure. The overdrive voltage generator 100 may be configured to provide an overdrive voltage VOD required for operating a SA circuit 900 in at least one bank of a DRAM, which should however not be construed as a limitation in the disclosure. As a matter of fact, the overdrive voltage generator 100 provided herein may be applied to other circuits with the overdrive demands.

As shown in FIG. 2, a voltage regulator 800 may generate a bit line highest-level voltage VBLH according to a power of a second power supply VDD2; after the initial operation time period of the SA circuit 900, the voltage regulator 800 provides the bit line highest-level voltage VBLH to the SA circuit 900 through a switch SW92, so that the SA circuit 900 may sense signals of bit line pairs BL and/BL. Here, the voltage of the second power supply VDD2 is greater than the bit line highest-level voltage VBLH. Particularly, the voltage regulator 800 may include but is not limited to a switch SW81, a comparator 820, and a capacitor C3. A first terminal of the switch SW81 is coupled to the second power supply VDD2. A second terminal of the switch SW81 outputs the bit line highest-level voltage VBLH. An non-inversion input terminal of the comparator 820 receives a reference voltage VREF_VBLH, an inversion input terminal of the comparator 820 is coupled to the second terminal of the switch SW81 to receive the bit line highest-level voltage VBLH, and an output terminal of the comparator 820 is coupled to a control terminal of the switch SW81, so as to turn on or turn off the switch SW81. The capacitor C3 is coupled between the second terminal of the switch SW81 and a ground terminal GND.

On the other hand, the overdrive voltage generator 100 may generate the overdrive voltage VOD according to the power of the first power supply VDD1 and the power of the second power supply VDD2 to transmit the overdrive voltage VOD through the switch SW91 to the SA circuit 900 during the initial operation time period, whereby the sensing speed of the SA circuit 900 may be increased. Here, the voltage of the first power supply VDD1 is greater than the overdrive voltage VOD, and the overdrive voltage VOD is greater than the voltage of the second power supply VDD2.

Particularly, the overdrive voltage generator 100 may include a first switching circuit 110, a second switching circuit 120, a boosting circuit 130, and a comparison circuit 140, which should however not be construed as a limitation in the disclosure. The first switching circuit 110 is coupled between the first power supply VDD1 and an output terminal OT, and is configured to be controlled by a switching signal SC to provide the overdrive voltage VOD to the output terminal OT.

The boosting circuit 130 is coupled between the second power supply VDD2 and a node OD, and is configured to boost the voltage of the second power supply VDD2 to provide a pump voltage VODP to the node OD. Here, the pump voltage VODP is lower than the voltage of the first power supply VDD1 but is greater than the overdrive voltage VOD.

The second switching circuit 120 is coupled between the node OD and the output terminal OT, and is configured to be controlled by the switching signal SC to provide the overdrive voltage VOD to the output terminal OT.

The comparison circuit 140 is coupled to the first switching circuit 110, the second switching circuit 120, and the output terminal OT, and is configured to compare the overdrive voltage VOD with a first reference voltage VREF1 to generate the switching signal SC. It can be understood that the first switching circuit 110 and the second switching circuit 120 are controlled by the same switching signal SC generated by the same comparison circuit 140, so as to jointly provide the overdrive voltage VOD.

According to an embodiment, the overdrive voltage generator 100 may further include capacitors C1 and C2. The capacitor C1 is coupled between the output terminal OT and the ground terminal GND and may store electrical energy and stabilize the overdrive voltage VOD. The capacitor C2 is coupled between the node OD and the ground terminal GND and may store electric energy and stabilize the pump voltage VODP. The operation of the overdrive voltage generator 100 is explained hereinafter.

The boosting circuit 130 may compare the pump voltage VODP with the second reference voltage VREF2. When the pump voltage VODP is lower than the second reference voltage VREF2, the boosting circuit 130 may perform a boosting operation to raise the pump voltage VODP. On the contrary, when the pump voltage VODP is higher than or equal to the second reference voltage VREF2, the boosting circuit 130 stops the boosting operation, so as to maintain the pump voltage VODP to be at the second reference voltage VREF2. In an embodiment, the boosting circuit 130 may be implemented in form of a known voltage pump circuit, for instance, which should however not be construed as a limitation in the disclosure.

In another aspect, when the overdrive voltage VOD is lower than the first reference voltage VREF1, the comparison circuit 140 may generate the switching signal SC (e.g., at the first voltage level) to turn on the first switching circuit 110 and the second switching circuit 120, thereby increasing the overdrive voltage VOD. By contrast, if the overdrive voltage VOD is higher than or equal to the first reference voltage VREF1, the comparison circuit 140 may generate the switching signal SC (e.g., at the second voltage level) to turn off the first switching circuit 110 and the second switching circuit 120, thereby maintaining the overdrive voltage VOD to be at the first reference voltage VREF1.

According to an embodiment, the comparison circuit 140 may include a single comparator CMP1 having a non-inversion input terminal receiving the first reference voltage VREF1, an inversion input terminal coupled to the output terminal OT to receive the overdrive voltage VOD, and an output terminal outputting the switching signal SC.

According to an embodiment, the first switching circuit 110 may include at least one first transistor SW1. A first terminal of the at least one first transistor SW1 is coupled to the first power supply VDD1, a second terminal of the at least one first transistor SW1 is coupled to the output terminal OT, and a control terminal of the at least one first transistor SW1 receives the switching signal SC. Here, the at least one first transistor SW1 may be but is not limited to a p-type metal oxide semiconductor field effect transistor (MOSFET), for instance. Similarly, the second switching circuit 120 may include at least one second transistor SW2. A first terminal of the at least one second transistor SW2 is coupled to the node OD, a second terminal of the at least one second transistor SW2 is coupled to the output terminal OT, and a control terminal of the at least one second transistor SW2 receives the switching signal SC. Here, the at least one second transistor SW2 may be but is not limited to a p-type MOSFET, for instance.

Note that the at least one first transistor SW1 and the at least one second transistor SW2 are controlled by the switching signal SC of the single comparator CMP and are then turned on or off, so as to maintain the overdrive voltage VOD to be at the first reference voltage VREF1. Hence, the overdrive voltage generator 100 provided in the embodiment as shown in FIG. 2 may be substantially considered as a digital voltage regulator. The digital voltage regulator is characterized by fast response speed, and once the transient load of the overdrive voltage VOD is excessive, which leads to the reduction of the voltage level of the overdrive voltage VOD, the digital voltage regulator can rapidly recover the voltage level of the overdrive voltage VOD. Hence, the overdrive voltage generator 100 may be configured to simultaneously provide the overdrive voltages VOD required for operating the SA circuits 900 in all banks of a DRAM.

In addition, since the output current of the first power supply VDD1 and the output current of the second power supply VDD2 are associated with the number of the first and second transistors SW1 and SW2, respectively, the number of the turned-on first and second transistors SW1 and SW2 may be controlled according to practical applications or design requirements, such that the power supply ratio between the first power supply VDD1 and the second power supply VDD2 can be adjusted.

Figure 3:
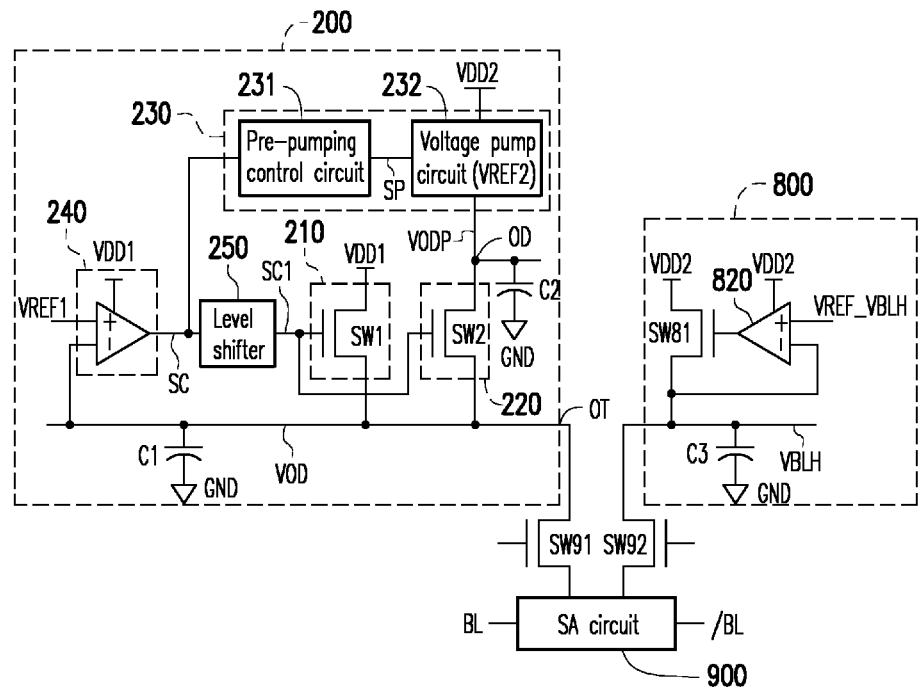
FIG. 3 is a schematic block and application view of an overdrive voltage generator according to another embodiment of the disclosure.

Please refer to FIG. 3, which is a schematic block and application view of an overdrive voltage generator according to an embodiment of the disclosure. The overdrive voltage generator 200 may be configured to provide an overdrive voltage VOD required for operating a SA circuit 900 in at least one bank of a DRAM, which should however not be construed as a limitation in the disclosure. As a matter of fact, the overdrive voltage generator 200 provided herein may be applied to other circuits with the overdrive demands. The way to implement and operate the voltage regulator 800, the switches SW91 and SW92, and the SA circuit 900 shown in FIG. 3 are similar to the way to implement and operate the voltage regulator 800, the switches SW91 and SW92 and the SA circuit 900 shown in FIG. 2, respectively. Therefore, the descriptions provided above may be taken as a reference, and no further explanation will be provided hereinafter.

The overdrive voltage generator 200 may include a first switching circuit 210, a second switching circuit 220, a boosting circuit 230, a comparison circuit 240, and a level shifter 250, which should however not be construed as a limitation in the disclosure. The comparison circuit 240 is similar to the comparison circuit 140 depicted in FIG. 2; therefore, one may refer to the above descriptions of the operation and implementation manner, and no other explanation will be provided hereinafter. The level shifter 250 is coupled to the comparison circuit 240 to receive the switching signal SC and shift a voltage swing range of the switching signal SC to generate a level shifting signal SC1. The first switching circuit 210 and the second switching circuit 220 are respectively similar to the first switching circuit 110 and the second switching circuit 120 depicted in FIG. 2, while the difference lies in that the first switching circuit 210 and the second switching circuit 220 are controlled by the level shifting signal SC1, so as to jointly provide the overdrive voltage VOD to the output terminal OT. The boosting circuit 230 is coupled between the second power supply VDD2 and the node OD, and is controlled by the switching signal SC to boost the voltage of the second power supply VDD2, so as to provide the pump voltage VODP to the node OD. This will be elaborated hereinafter.

According to an embodiment, the first switching circuit 210 may include at least one first transistor SW21. A first terminal of the at least one first transistor SW21 is coupled to the first power supply VDD1, a second terminal of the at least one first transistor SW21 is coupled to the output terminal OT, and a control terminal of the at least one first transistor SW21 receives the level shifting signal SC1. Here, the at least one first transistor SW21 may be but is not limited to an n-type MOSFET, for instance. Similarly, the second switching circuit 220 may include at least one second transistor SW22. A first terminal of the at least one second transistor SW22 is coupled to the node OD, a second terminal of the at least one second transistor SW22 is coupled to the output terminal OT, and a control terminal of the at least one second transistor SW22 receives the level shifting signal SC1. Here, the at least one second transistor SW22 may be but is not limited to an n-type MOSFET, for instance. Note that the level shifter 250 shifts the voltage swing range of the switching signal SC to generate the level shifting signal SCI, so as to ensure that the first and second transistors SW21 and SW22 (the n-type MOSFETs) may be completely turned on or off.

Similar to the overdrive voltage generator 100 provided in the embodiment depicted in FIG. 2, the overdrive voltage generator 200 provided in the embodiment depicted in FIG. 3 may also be substantially considered as a digital voltage regulator and is thus characterized by fast response speed. Once the transient load of the overdrive voltage VOD is excessive, which leads to the reduction of the voltage level of the overdrive voltage VOD, the overdrive voltage regulator 200 can rapidly recover the voltage level of the overdrive voltage VOD. Hence, the overdrive voltage generator 200 may be configured to simultaneously provide the overdrive voltages VOD required for operating the SA circuits 900 in all banks of a DRAM.

In addition, since the output current of the first power supply VDD1 and the output current of the second power supply VDD2 are associated with the number of the first and second transistors SW21 and SW22, respectively, the number of the turned-on first and second transistors SW21 and SW22 may be controlled according to practical applications or design requirements, such that the power supply ratio between the first power supply VDD1 and the second power supply VDD2 can be adjusted according to actual application or design requirements.

The way to operate and implement the boosting circuit 230 is explained hereinafter. As previously described, the switching signal SC generated by the comparison circuit 240 may control the operation of the boosting circuit 230. Specifically, when the overdrive voltage VOD is lower than the first reference voltage VREF1, the comparison circuit 240 may generate the switching signal SC (e.g., at the first voltage level), and the level shifting signal SC1 may be generated by the level shifter 250 to turn on the first switching circuit 210 and the second switching circuit 220, thereby increasing the overdrive voltage VOD. At this time, the switching signal SC generated by the comparison circuit 240 also triggers the boosting circuit 230; thereby, when the second switching circuit 220 is being turned on, the boosting circuit 230 may pump the voltage of the node OD in advance to stabilize the pump voltage VODP. As such, the pump voltage VODP can be prevented from falling to an overly low level due to the fact that the second switching circuit 220 draws power from the pump voltage VODP.

By contrast, if the overdrive voltage VOD is higher than or equal to the first reference voltage VREF1, the comparison circuit 240 generates the switching signal SC (e.g., at the second voltage level) and the level shifting signal SC1 is generated by the level shifter 250 to turn off the first switching circuit 210 and the second switching circuit 220, thereby maintaining the overdrive voltage VOD to be at the first reference voltage VREF1. At this time, the switching signal SC stops triggering the boosting circuit 230.

Besides, similar to the boosting circuit 130 of depicted in FIG. 2, the boosting circuit 230 depicted in FIG. 3 may also compare the pump voltage VODP with the second reference voltage VREF2 to determine whether to raise the pump voltage VODP. The description of the detailed operation of the boosting circuit 230 may be learned from the description of the boosting circuit 130 shown in FIG. 2 and therefore will not be provided hereinafter.

In an embodiment, the boosting circuit 230 may include a pre-pumping control circuit 231 and a voltage pump circuit 232. The pre-pumping control circuit 231 is coupled to the comparison circuit 240 to receive the switching signal SC and generate a pulse signal SP in response to the switching signal SC. The voltage pump circuit 232 is coupled to the pre-pumping control circuit 231 to receive the pulse signal SP and boost the voltage of the second power supply VDD2 in response to the pulse signal SP, so as to generate the pump voltage VODP and provide the pump voltage VODP to the node OD. Particularly, the voltage pump circuit 232 may boost the voltage of the second power supply VDD2 in response to the pulse signal SP to pre-pump the voltage of the node OD, thereby stabilizing the pump voltage VODP. In addition, the voltage pump circuit 232 may compare the pump voltage VODP with the second reference voltage VREF2. When the pump voltage VODP is lower than the second reference voltage VREF2, the boosting circuit 232 boosts the voltage of the second power supply VDD2 to raise the pump voltage VODP.

In an embodiment, the pre-pumping control circuit 231 may include a one-shot circuit that may generate the pulse signal SP according to an edge (e.g., a rising edge or a falling edge) of the switching signal SC.

Figure 4:
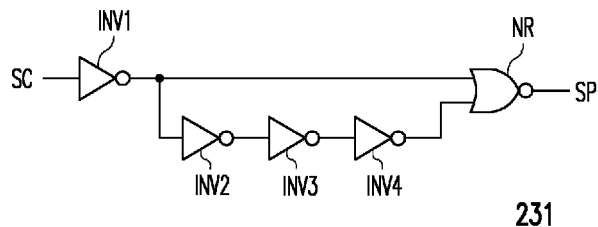
FIG. 4 is a schematic block view of a pre-pumping control circuit according to an embodiment of the disclosure.

In another embodiment, as shown in FIG. 4, the pre-pumping control circuit 231 may include but is not limited to NOT gates INV1-INV4 and a NOR gate NR. An input terminal of the NOT gate INV1 receives the switching signal SC, and an output terminal of the NOT gate INV1 is coupled to a first input terminal of the NOR gate NR. The NOT gates INV2-INV4 are sequentially and serially connected between the output terminal of the NOT gate INV1 and a second input terminal of the NOR gate NR. An output terminal of the NOR gate NR may output the pulse signal SP.

Figure 5:
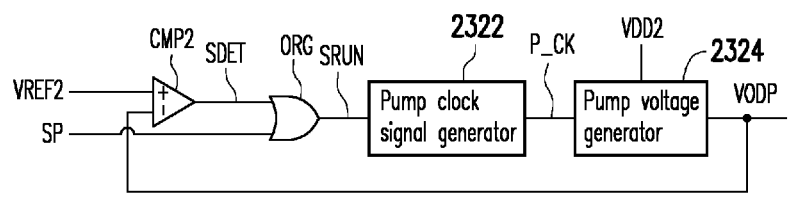
FIG. 5 is a schematic block view of a voltage pump circuit according to an embodiment of the disclosure.

In an embodiment, as shown in FIG. 5, the voltage pump circuit 232 may include a comparator CMP2, an OR gate ORG, a pump clock signal generator 2322, and a pump voltage generator 2324. A non-inversion input terminal of the comparator CMP2 receives the second reference voltage VREF2, an inversion input terminal of the comparator CMP2 is coupled to the node OD (shown in FIG. 3) to receive the pump voltage VODP, and an output terminal of the comparator CMP2 outputs a detection signal SDET. A first input terminal of the OR gate ORG is coupled to the output terminal of the comparator CMP2 to receive the detection signal SDET, a second input terminal of the OR gate ORG is coupled to the pre-pumping control circuit 231 (shown in FIG. 3) to receive the pulse signal SP, and an output terminal of the OR gate ORG outputs a running signal SRUN. The pump clock signal generator 2322 is coupled to the output terminal of the OR gate ORG to receive the running signal SRUN and accordingly generate a pump clock signal P_CK. The pump voltage generator 2324 is coupled to the pump clock signal generator 2322 to receive the pump clock signal P_CK and accordingly generate the pump voltage VODP. According to an embodiment, the pump clock signal generator 2322 and the pump voltage generator 2324 may be implemented by a known pump clock signal generating circuit and a pump voltage generating circuit, respectively.

Figure 6:
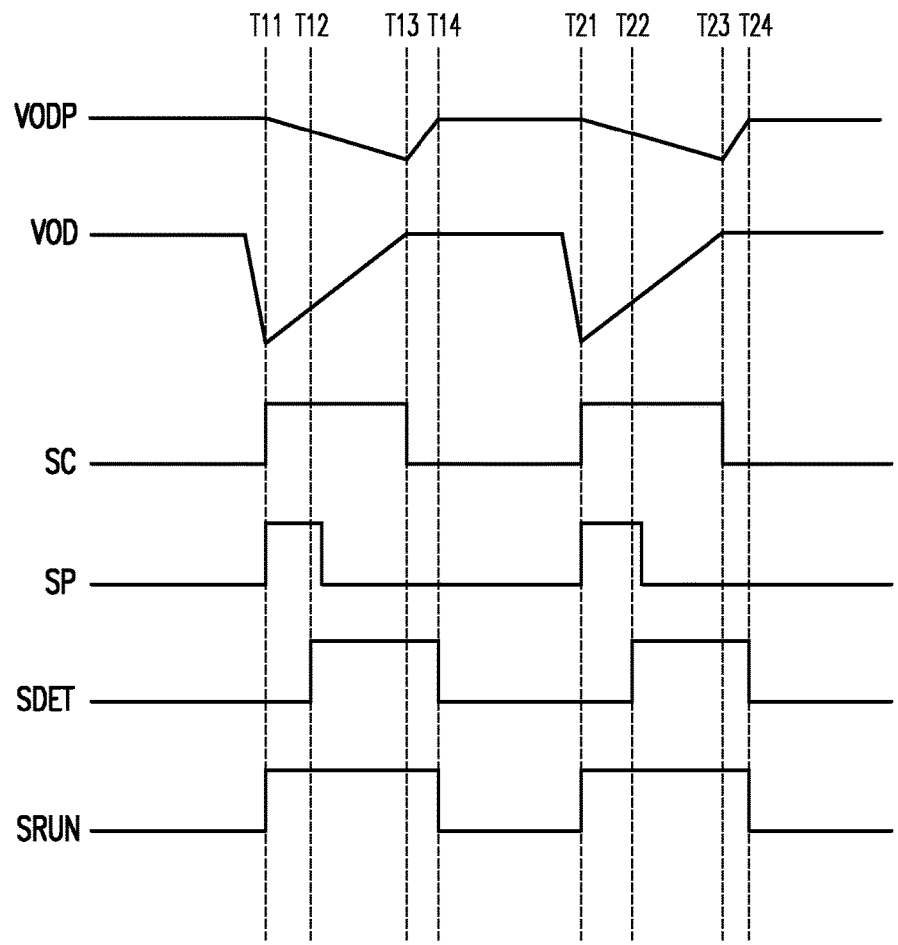
FIG. 6 is a timing diagram of signals of the overdrive voltage generator according to an embodiment of the disclosure.

Please refer to FIG. 3 to FIG. 6 together. FIG. 6 is a timing diagram of signals of the overdrive voltage generator shown in FIG. 3, the pre-pumping control circuit shown in FIG. 4, and the voltage pump circuit shown in FIG. 5 according to an embodiment of the disclosure. At a time point T11, the comparison circuit 240 determines that the overdrive voltage VOD is lower than the first reference voltage VREF1 and thus outputs the switching signal SC at the logic-high level, for instance, and the comparison circuit 240 turns on the first switching circuit 210 and the second switching circuit 220 through the level shifter 250, thereby increasing the overdrive voltage VOD. At this time, the pre-pumping control circuit 231 generates the pulse signal SP in response to the rising edge of the switching signal SC, and the running signal SRUN is outputted by the OR gate ORG of the voltage pump circuit 232 to allow the pump clock signal generator 2322 and the pump voltage generator 2324 to start running. Thereby, when the second switching circuit 220 is being turned on, the pump voltage generator 2324 may pump the voltage of the node OD in advance for a period of time (i.e., the width of the pulse signal SP) to avoid the pump voltage VODP from being dropped to an overly low level due to the fact that the second switching circuit 220 draws power from the pump voltage VODP.

Since the second switching circuit 220 continuously draws power from the pump voltage VODP, the pump voltage VDOP starts to decrease, and the overdrive voltage VOD starts to increase. At a time point T12, the comparator CMP2 (shown in FIG. 5) of the voltage pump circuit 232 determines that the pump voltage VODP is lower than the second reference voltage VREF2 and thus outputs the detection signal SDET at the logic-high level, for instance, and the logic-high running signal SRUN is outputted by the OR gate ORG of the voltage pump circuit 232, so as to keep the pump clock signal generator 2322 and the pump voltage generator 2324 running to continuously pump the voltage of the node OD.

At a time point T13, the comparison circuit 240 determines that the overdrive voltage VOD is increased to be equal to the first reference voltage VREF1 and thus outputs the switching signal SC at the logic-low level, for instance, and the first switching circuit 210 and the second switching circuit 220 are turned off by the level shifter 250. At this time, the second switching circuit 220 is turned off and thus stops drawing power from the pump voltage VODP, so that the pump voltage VODP starts to rise. At a time point T14, the comparator CMP2 of the voltage pump circuit 232 determines that the pump voltage VODP rises to be equal to the second reference voltage VREF2 and thus outputs the detection signal SDET at the logic-low level, for instance, and the logic-low running signal SRUN is outputted by the OR gate ORG of the voltage pump circuit 232, so that the pump clock signal generator 2322 and the pump voltage generator 2324 stops pumping the voltage of the node OD.

In addition, the operations of the overdrive voltage generator 200 at the time points T21-T24 in FIG. 6 are similar to the operations at the time points T11-T14, respectively, so the above description may serve as a reference and will not be repeated herein.

To sum up, the overdrive voltage generator provided in one or more embodiments may be deemed as a digital voltage regulator characterized by fast response speed and thus may be applied to provide the overdrive voltage required by operations of all SA circuits of the DRAM. Besides, the overdrive voltage generator may pre-pump the voltage of the node when the overdrive voltage is lower than the first reference voltage, so as to stabilize the pump voltage and prevent the pump voltage from being excessively drawn power and dropped too low.

It will be apparent to those skilled in the art that various modifications and variations can be made to the structure of the disclosure without departing from the scope or spirit of the disclosure. In view of the foregoing, it is intended that the disclosure cover modifications and variations provided they fall within the scope of the following claims and their equivalents.

What is claimed is:

1. An overdrive voltage generator comprising:
   a first switching circuit coupled between a first power supply and an output terminal and configured to be controlled by a switching signal to provide an overdrive voltage to the output terminal;
   a boosting circuit coupled between a second power supply and a node and configured to boost a voltage of the second power supply to provide a pump voltage to the node;
   a second switching circuit coupled between the node and the output terminal and configured to be controlled by the switching signal to provide the overdrive voltage to the output terminal; and
   a comparison circuit coupled to the first switching circuit, the second switching circuit, and the output terminal and configured to compare the overdrive voltage with a first reference voltage to generate the switching signal.

2. The overdrive voltage generator according to claim 1, wherein when the overdrive voltage is lower than the first reference voltage, the comparison circuit generates the switching signal to turn on the first switching circuit and the second switching circuit.

3. The overdrive voltage generator according to claim 2, wherein when the overdrive voltage is higher than or equal to the first reference voltage, the comparison circuit generates the switching signal to turn off the first switching circuit and the second switching circuit.

4. The overdrive voltage generator according to claim 1, wherein the boosting circuit is further coupled to the comparison circuit to receive the switching signal and is controlled by the switching signal to boost the voltage of the second power supply and provide the pump voltage to the node.

5. The overdrive voltage generator according to claim 4, wherein when the overdrive voltage is lower than the first reference voltage, the comparison circuit generates the switching signal to trigger the boosting circuit and turn on the first switching circuit and the second switching circuit.

6. The overdrive voltage generator according to claim 5, wherein when the overdrive voltage is higher than or equal to the first reference voltage, the comparison circuit generates the switching signal to stop trigging the boosting circuit and turn off the first switching circuit and the second switching circuit.

7. The overdrive voltage generator according to claim 1, wherein the boosting circuit compares the pump voltage with a second reference voltage, and when the pump voltage is lower than the second reference voltage, the boosting circuit performs a boosting operation.

8. The overdrive voltage generator according to claim 7, wherein when the pump voltage is higher than or equal to the second reference voltage, and when the overdrive voltage is higher than or equal to the first reference voltage, the boosting circuit stops performing the boosting operation.

9. The overdrive voltage generator according to claim 7, wherein the second reference voltage is higher than the first reference voltage.

10. The overdrive voltage generator according to claim 1, wherein the first switching comprises:
    at least one first transistor having a first terminal coupled to the first power supply, a second terminal coupled to the output terminal, and a control terminal receiving the switching signal,
    wherein the second switching circuit comprises:
    at least one second transistor having a first terminal coupled to the node, a second terminal coupled to the output terminal, and a control terminal receiving the switching signal.

11. The overdrive voltage generator according to claim 10, wherein the at least one first transistor and the at least one second transistor are p-type metal oxide semiconductor field effect transistors.

12. The overdrive voltage generator according to claim 1, further comprising:
    a level shifter coupled to the comparison circuit to receive the switching signal and shift a voltage swing range of the switching signal to generate a level shifting signal,
    wherein the first switching comprises:
    at least one first transistor having a first terminal coupled to the first power supply, a second terminal coupled to the output terminal, and a control terminal receiving the level shifting signal,
    wherein the second switching circuit comprises:
    at least one second transistor having a first terminal coupled to the node, a second terminal coupled to the output terminal, and a control terminal receiving the level shifting signal.

13. The overdrive voltage generator according to claim 12, wherein the at least one first transistor and the at least one second transistor are n-type metal oxide semiconductor field effect transistors.

14. The overdrive voltage generator according to claim 1, wherein the boosting circuit comprises:
    a pre-pumping control circuit coupled to the comparison circuit to receive the switching signal and generate a pulse signal in response to the switching signal; and
    a voltage pump circuit coupled to the pre-pumping control circuit to receive the pulse signal and boost the voltage of the second power supply in response to the pulse signal, so as to generate the pump voltage and provide the pump voltage to the node.

15. The overdrive voltage generator according to claim 14, wherein the pre-pumping control circuit comprises:
    a one-shot circuit configured to generate the pulse signal according to an edge of the switching signal.

16. The overdrive voltage generator according to claim 14, wherein the voltage pump circuit boosts the voltage of the second power supply in response to the pulse signal to generate and stabilize the pump voltage.

17. The overdrive voltage generator according to claim 14, wherein
    the voltage pump circuit further compares the pump voltage with a second reference voltage, and when the pump voltage is lower than the second reference voltage, the voltage pump circuit boosts the voltage of the second power supply to raise the pump voltage.

18. The overdrive voltage generator according to claim 14, wherein the voltage pump circuit comprises:
    a comparator having a non-inversion input terminal receiving a second reference voltage, an inversion input terminal coupled to the node to receive the pump voltage, and an output terminal outputting a detection signal;
    an OR gate having a first input terminal coupled to the output terminal of the comparator to receive the detection signal, a second input terminal coupled to the pre-pumping control circuit to receive the pulse signal, and an output terminal outputting a running signal;

a pump clock signal generator coupled to the output terminal of the OR gate to receive the running signal and accordingly generate a pump clock signal; and a pump voltage generator coupled to the pump clock signal generator to receive the pump clock signal and accordingly generate the pump voltage.

19. The overdrive voltage generator according to claim 1, wherein the comparison circuit comprises:

a single comparator having a non-inversion input terminal receiving the first reference voltage, an inversion input terminal coupled to the output terminal to receive the overdrive voltage, and an output terminal outputting the switching signal.

* * * * *